United States Patent [19]
Martin et al.

[11] Patent Number: 5,652,435
[45] Date of Patent: Jul. 29, 1997

[54] VERTICAL STRUCTURE SCHOTTKY DIODE OPTICAL DETECTOR

[75] Inventors: Eric A. Martin, Medford; Kenneth Vaccaro, Acton, both of Mass.; Stephen M. Spaziani, Nashua, N.H.

[73] Assignee: The United States of America as represented by the Secretary of the Air Force, Washington, D.C.

[21] Appl. No.: 522,902

[22] Filed: Sep. 1, 1995

[51] Int. Cl.$^6$ ............................................. H01L 31/00
[52] U.S. Cl. ........................ 257/21; 257/184; 257/449; 257/453
[58] Field of Search .......................... 257/184, 449, 257/453, 21, 456; 372/45, 46, 44

[56] References Cited

U.S. PATENT DOCUMENTS

| | | | |
|---|---|---|---|
| 4,593,304 | 6/1986 | Slayman et al. | 357/30 |
| 4,777,148 | 10/1988 | Liau et al. | 437/129 |
| 5,051,372 | 9/1991 | Sasaki | 257/197 X |
| 5,077,593 | 12/1991 | Sato et al. | 257/189 X |
| 5,107,318 | 4/1992 | Makiuchi et al. | 257/458 |
| 5,140,381 | 8/1992 | Badoz et al. | 357/4 |
| 5,166,989 | 11/1992 | Kurdi et al. | 385/11 |
| 5,190,883 | 3/1993 | Menigaux et al. | 437/3 |
| 5,198,682 | 3/1993 | Wu et al. | 257/185 X |
| 5,343,054 | 8/1994 | Maroney, III et al. | 257/453 X |
| 5,352,904 | 10/1994 | Wen et al. | 257/184 X |
| 5,391,869 | 2/1995 | Ade et al. | 250/227.24 |
| 5,472,914 | 12/1995 | Martin et al. | 437/209 |
| 5,541,438 | 7/1996 | Martin et al. | 257/447 |

*Primary Examiner*—William Mintel
*Attorney, Agent, or Firm*—Robert L. Nathans

[57] ABSTRACT

A vertical structure Schottky contact photodiode has a narrow bandgap InGaAs light absorbing layer cladded front and back with InAlAs current blocking layers having metal contacts formed thereon. As compared to single-side MSM photodiodes, with interdigitated electrodes lying in a single plane, response time is improved due to reduced spacing between the electrodes. Response time is also improved since capacitance is reduced due to inherently low doping levels in the semiconductor material. Laterally offset finger electrodes are made light reflective to increase the production of carriers in the InGaAs absorption layer.

22 Claims, 1 Drawing Sheet

VERTICAL STRUCTURE SCHOTTKY DIODE OPTICAL DETECTOR

STATEMENT OF GOVERNMENT INTEREST

The invention described herein may be manufactured and used by or for the Government for governmental purposes without the payment of any royalty thereon.

BACKGROUND OF THE INVENTION

The present invention relates to the field of optical detectors for converting light into an electrical signal.

Schottky diodes are semiconductor structures replacing the current blocking p-n junction with a metal-semiconductor junction. Such diodes can out-perform standard p-i-n diodes because of their lower capacitance. A special case of the Schottky diode detector is the lateral Metal-Semiconductor-Metal (MSM) detector. Using the same metal for the anode and cathode makes the device easier to fabricate. MSM detectors are currently fabricated in a planar geometry as compared to the vertical geometry of the p-i-n diode. As with all optical detectors, the speed of the MSM can be dictated by carrier life time, carrier transit time, or parasitic RC effects. In the past, decreasing the carrier lifetime by addition of defects or recombination centers resulted in fast pulse response, but seriously degraded sensitivity. RC effects are reduced by a planar interdigitated layout. More recently transit time limited devices have been fabricated with sub-micrometer electrode finger spacing. These small linewidths are difficult to fabricate. Modeling of sub-micrometer finger spacing MSM devices have revealed several interesting aspects of device design. The electric-field lines becomes localized at the surface of the device. In this case, carriers generated in the neutral region far from the surface must diffuse into the high field region before collection, limiting the ultimate speed of these devices.

Fabrication of MSM detectors requires the formation of high quality Schottky barriers, with low reverse leakage current. This is not easily achieved on a low band-gap material, such as InGaAs. However, a barrier enhancing layer, such as InAlAs, improves the performance of such devices.

SUMMARY OF PREFERRED EMBODIMENTS OF THE INVENTION

The aforesaid problems associated with the prior art MSM photodetectors are met by eliminating the interdigitated planar electrode fingers, and providing a vertically structured photodetector having upper and lower InAlAs Schottky current blocking layers straddling an InGaAs light absorption layer. Each current blocking layer is in Schottky contact with an associated highly electrically conductive metallic finger-like set of Ti/Au electrodes. The optical detector response time is greatly improved, due to the reduced spacing between electrodes, which becomes the semiconductor layer thickness, rather than an undesired and difficult to control lithographically defined dimension. Also, the response time is improved, relative to vertical p-i-n photodiodes, due to reduced capacitance attributed to the inherently low doping level in the semiconductor material.

The fingers of each electrode set can be laterally offset with respect to the fingers of the other set so as to increase the number of photon generated carriers produced in the InGaAs light absorption layer. Also, each set of electrodes may be reflective to redirect the light coming from the upper or front portion of the detector back through the light absorbing layer to create a second pass therethrough, to further increase the carriers produced. Optionally, integral distributed Bragg reflector regions may be positioned between the electrode fingers at lower portions of the detector, to enhance the amount of light reflected.

BRIEF DESCRIPTION OF THE DRAWINGS

Other objects, features and advantages of the present invention will become apparent upon study of the following detailed description, taken in conjunction with the drawings in which.

DETAILED DESCRIPTION OF PREFERRED EMBODIMENTS OF THE INVENTION

Figure 1:
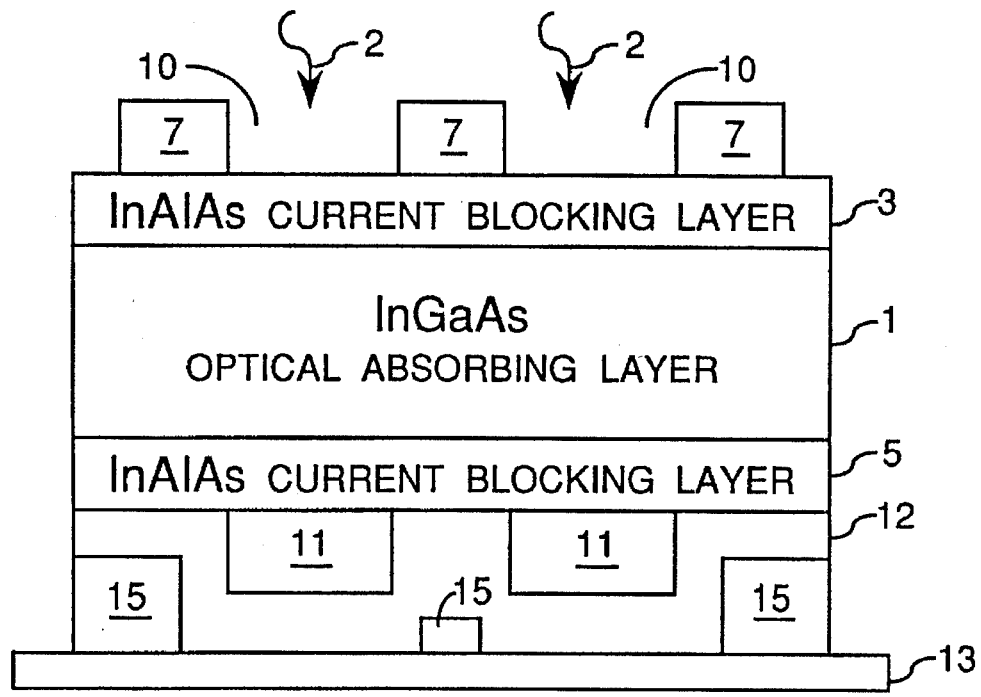
FIG. 1 illustrates a first embodiment of the invention having Sckottky contacts adjacent upper and lower surfaces of the light absorption layer.

In FIG. 1, a light absorbing layer 1 of InGaAs is straddled by a first InAlAs current blocking cladding layer 3 and a second InAlAs current blocking cladding layer 5. A first set of finger electrodes 7 is in Schottky contact with blocking layer 3 and a second electrode means 11 is in Schottky contact with current blocking layer 5. Thus, the opaque metallic electrodes make a rectifying Schottky contact to each of the undoped InAlAs buffer layers. The incoming optical signal 2 passes through the upper portion of the photodetector wherein light transmissive areas 10 are present between the electrode fingers 7 which are formed of an opaque metallic conductor, preferably low resistivity titanium plated with gold. This is in contrast with copending Vaccaro et al. application Ser. No. 08/486,442, filed 8 Jun. 1995, wherein an upper electrode means is provided comprising light transparent finger electrode members, having a relatively higher resistivity which is responsible for a higher undesired RC time constant. The device of the present invention can be fabricated in accordance with techniques disclosed in prior copending applications of Vaccaro, Martin et al., including Ser. No. 18/274,889, filed 14 Jul. 1994, and assigned to the same assignee of the present invention.

Briefly, the InAlAs layer 5 is first epitaxially grown on an InP crystal substrate, not shown, and the remaining layers are deposited in accordance with known techniques. The upper or frontside electrode fingers 7 are formed by conventional surface patterning and lithographic techniques, and the lower, backside electrode fingers 11 are formed after substrate removal per the last mentioned pending patent application. The InGaAs optical absorption layer 1 has a preferred thickness of 0.2–1.0 micrometers, and the thinner InAlAs blocking layers each have a preferred thickness of between 25–100 nanometers. The finger-like electrode members 7 are typically made of titanium, having a thickness of about 50 nanometers, covered with a thicker layer of gold for providing very low resistivity.

As compared to the aforesaid prior art single sided MSM photodiodes with interdigitated finger electrodes on a common upper surface, the response time of the detector of the present invention is improved due to reduced spacing between the electrodes, which now becomes the readily controllable layer thicknesses, rather than lithographically defined dimensions previously mentioned. Importantly, these thicknesses may be strictly controlled to produce the desired operating parameters. Also, as compared to vertical p-i-n photodiodes, response time is reduced due to reduced capacitance owing to the inherently low doping level in the semiconductor material. The second electrode means comprising a second set of fingers 11 is preferably made of a light reflective metal to redirect light already passed through light absorbing layer 1, back through this layer, to increase the number of collected carriers. Supporting substrate 13 is made of a low dielectric constant insulating substrate which reduces parasitic capacitance and leakage currents. Material 12 is a passivation coating, whereas epoxy 15 fills the spaces between the substrate and the second electrode means as shown.

Figure 2:
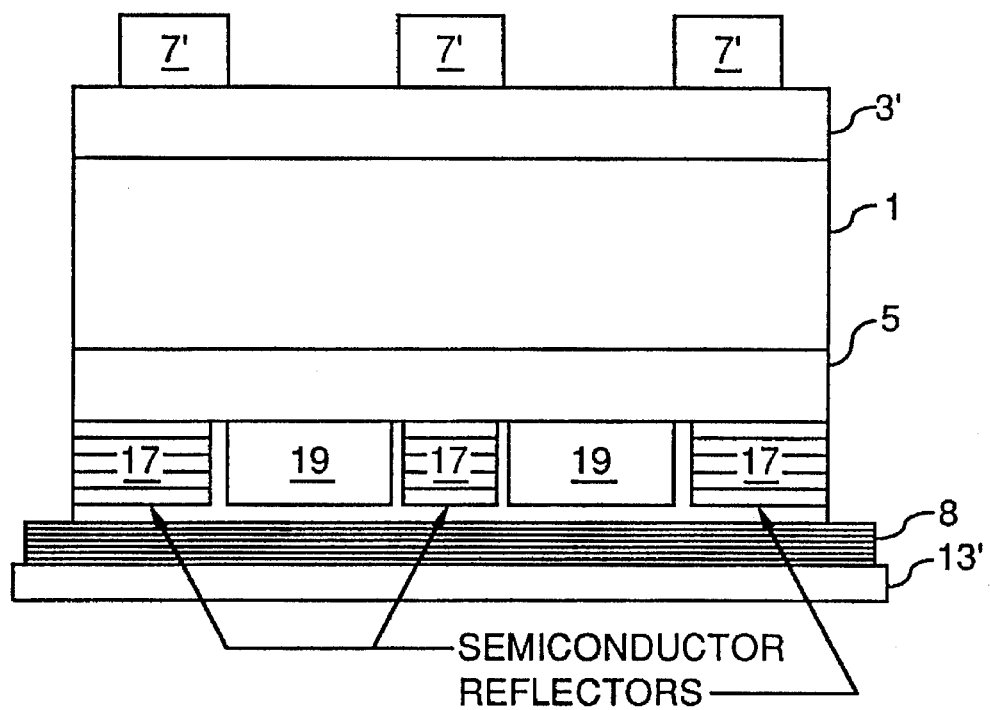
FIG. 2 illustrates another embodiment having semiconductive reflectors upon lower portions thereof.

FIG. 2 illustrates another embodiment of the invention whereby parts corresponding to the parts of FIG. 1 are represented by primed numbers. Layer 8 comprises epoxy, and the second electrode set of fingers is formed by reflective and electrically conductive finger members 19, separated by stacks of semiconductive distributed-Bragg-reflectors 17, which are well known in the art, and comprise alternating layers of semiconductor materials with dissimilar indexes of refraction. Such alternating layers in each stack forming reflectors 19, could be InP and InAlAsP. Note that the finger members of each electrode set are laterally offset, or aligned as to be complementary, with respect to the electrodes of the other set, as shown. This embodiment of the invention maximizes the amount of reflected light to be sent back through the absorption layer 1.

These devices may be readily transferred into a receiver/amplifier as described in our copending patent application Ser. No. 08/274,882, filed 14 Jul. 1994. Other embodiments of the present invention will become apparent to those skilled in the art and thus the scope of the invention is to be limited solely by the terms of the following claims and art recognized equivalents thereof. For example, layer 1 may be made of III-V semiconductive materials equivalent to InGaAs, and likewise, layers 3 and 7 may be made of other semiconductive materials equivalent to InAlAs.

What is claimed is:

1. A vertical metal-semiconductor-metal photodetector comprising:
   (a) an InGaAs optical absorbing layer having a first InAlAs current blocking layer positioned over said InGaAs optical absorbing layer, and a first electrode means including a first set of metallic electrodes positioned over said first current blocking layer and in contact therewith, said first set of electrodes having light transmissive areas between said metallic electrodes; and
   (b) a second InAlAs current blocking layer positioned under said optical absorbing layer, and second electrode means in contact with an underside portion of said second InAlAs current blocking layer.

2. The photodetector of claim 1 wherein said InGaAs optical absorbing layer has a thickness of 0.2–1.0 micrometers, and said InAlAs blocking layers each have thicknesses of between 25–100 nanometers.

3. The photodetector of claim 1 wherein said first set of metallic electrodes comprise elongated fingers.

4. The photodetector of claim 2 wherein said first set of metallic electrodes comprise elongated fingers.

5. The photodetector of claim 3 wherein said second electrode means includes a second set of fingers, laterally offset with respect to the first set of fingers of said first electrode means, for increasing the light absorption ability of said optical absorbing layer.

6. The photodetector of claim 4 wherein said second electrode means includes a second set of fingers, laterally offset with respect to the first set of fingers of said first electrode means, for increasing the light absorption ability of said optical absorbing layer.

7. The photodetector of claim 1 wherein semiconductive light reflective means is positioned upon a lower portion of the photodetector for directing light coming from an upper portion of the photodetector back through the optical absorbing layer for increasing the light absorption ability of said optical absorbing layer.

8. The photodetector of claim 2 wherein semiconductive light reflective means is positioned upon a lower portion of the photodetector for directing light coming from an upper portion of the photodetector back through the optical absorbing layer for increasing the light absorbtion ability of said optical absorbing layer.

9. The photodetector of claim 5 wherein semiconductive light reflective means is positioned upon a lower portion of the photodetector for directing light coming from an upper portion of the photodetector back through the optical absorbing layer for increasing the light absorption ability of said optical absorbing layer.

10. The photodetector of claim 6 wherein semiconductive light reflective means is positioned upon a lower portion of the photodetector for directing light coming from an upper portion of the photodetector back through the optical absorbing layer for increasing the light absorption ability of said optical absorbing layer.

11. The photodetector of claim 1 wherein said second electrode means includes a light reflective Schottky barrier layer.

12. The photodetector of claim 7 wherein said second electrode means includes a light reflective Schottky barrier layer.

13. The photodetector of claim 8 wherein said second electrode means includes a light reflective Schottky barrier layer.

14. The photodetector of claim 9 wherein said second electrode means includes a light reflective Schottky barrier layer.

15. The photodetector of claim 10 wherein said second electrode means includes a light reflective Schottky barrier layer.

16. A vertical metal-semiconductor-metal photodetector comprising:
   (a) an InGaAs optical absorbing layer having a first InAlAs current blocking layer positioned over said InGaAs optical absorbing layer, and a first electrode means positioned over said first current blocking layer and in contact therewith; and
   (b) a second InAlAs current blocking layer positioned under said optical absorbing layer, and second electrode means in contact with an underside portion of said second InAlAs current blocking layer.

17. The photodetector of claim 16 wherein said InGaAs optical absorbing layer has a thickness of 0.2–1.0 micrometers, and said InAlAs blocking layers each have thicknesses of between 25–100 nanometers.

18. The photodetector of claim 16 wherein light reflective means is positioned upon a lower portion of the photodetector for directing light coming from an upper portion of the photodetector back through the optical absorbing layer for increasing the light absorption ability of said optical absorbing layer.

19. The photodetector of claim 1 wherein said InAlAs current blocking layers are undoped.

20. The photodetector of claim 2 wherein said InAlAs current blocking layers are undoped.

21. The photodetector of claim 16 wherein said InAlAs current blocking layers are undoped.

22. The photodetector of claim 17 wherein said InAlAs current blocking layers are undoped.

* * * * *